US012745370B2

(12) United States Patent
Ibert et al.

(10) Patent No.: US 12,745,370 B2
(45) Date of Patent: Sep. 22, 2026

(54) ROBOT-ASSISTED MONITORING OF POTENTIAL HEAT ANOMALIES IN A DATACENTER RACK ASSEMBLIES

(71) Applicant: OVH, Roubaix (FR)

(72) Inventors: Dorian Ibert, Roubaix (FR); Christophe Maurice Thibaut, Noyelles les Seclin (FR)

(73) Assignee: OVH, Roubaix (FR)

( * ) Notice: Subject to any disclaimer, the term of this patent is extended or adjusted under 35 U.S.C. 154(b) by 356 days.

(21) Appl. No.: 18/238,114

(22) Filed: Aug. 25, 2023

(65) Prior Publication Data

US 2024/0074116 A1 Feb. 29, 2024

(30) Foreign Application Priority Data

Aug. 30, 2022 (EP) .................................... 22306284

(51) Int. Cl.
*G05D 1/00* (2024.01)
*H05K 7/20* (2006.01)

(52) U.S. Cl.
CPC ........... *H05K 7/207* (2013.01); *G05D 1/0212* (2013.01); *G05D 1/0246* (2013.01)

(58) Field of Classification Search
None
See application file for complete search history.

(56) References Cited

U.S. PATENT DOCUMENTS 7,072,739 B2 7/2006 Bash et al.
7,272,945 B2 9/2007 Bash et al.
8,676,397 B2 * 3/2014 Longobardi ....... H05K 7/20836 700/277
8,885,335 B2 * 11/2014 Magarelli ............... G06F 1/206 361/679.54
9,310,251 B2 4/2016 Das et al.
(Continued)

FOREIGN PATENT DOCUMENTS

CN 208312637 U 1/2019

OTHER PUBLICATIONS

European Search Report with regard to the European Patent Application No. 22306284.5 completed Feb. 10, 2023.
(Continued)

*Primary Examiner* — Jason Lin
(74) *Attorney, Agent, or Firm* — BCF LLP

(57) ABSTRACT

The disclosed systems and methods are directed to providing the mobile robot-assisted thermal monitoring of server racks in a datacenter. The thermal monitoring comprises a plurality of thermal sensors to detect temperature data of each of the server racks, a plurality of power distribution units (PDUs) to detect electrical power consumption of each of the servers, a datacenter operations controller configured to generate a temperature gradient profile over time for each of the server racks, determine a potential anomalous thermal condition of a server rack, and identify the server rack as a point-of-interest (POI). The thermal monitoring further comprises a mobile robot configured to travel to and capture the surface temperature image data of the identified POI server rack based on a provided navigation transit route and the datacenter operations controller updating the temperature gradient profile based on the capture the surface temperature image data.

16 Claims, 6 Drawing Sheets

(56) References Cited

U.S. PATENT DOCUMENTS

| | | | | |
|---|---|---|---|---|
| 9,463,574 | B2 | 10/2016 | Purkayastha et al. | |
| 9,606,542 | B2 | 3/2017 | Guo et al. | |
| 9,908,239 | B1 | 3/2018 | Obrien et al. | |
| 10,216,212 | B1 | 2/2019 | Gutierrez | |
| 10,516,981 | B1 | 12/2019 | Lingle et al. | |
| 12,034,332 | B2 * | 7/2024 | Ye | H02J 9/068 |
| 2005/0113978 | A1 * | 5/2005 | Sharma | G05D 1/0282 700/259 |
| 2008/0288193 | A1 | 11/2008 | Claassen et al. | |
| 2011/0054689 | A1 * | 3/2011 | Nielsen | G05D 1/0214 700/258 |
| 2011/0071687 | A1 * | 3/2011 | Uraki | F24F 11/77 700/278 |
| 2011/0161712 | A1 * | 6/2011 | Athalye | G06F 1/3203 709/224 |
| 2012/0221872 | A1 * | 8/2012 | Artman | H05K 7/20836 713/320 |
| 2013/0010423 | A1 * | 1/2013 | Carlson | H05K 7/20827 361/679.47 |
| 2013/0231779 | A1 * | 9/2013 | Purkayastha | B25J 9/1697 700/258 |
| 2015/0185813 | A1 * | 7/2015 | Ping | G06F 1/3268 713/323 |
| 2016/0062421 | A1 * | 3/2016 | Sugawara | G06F 1/3268 700/299 |
| 2019/0354102 | A1 | 11/2019 | Inacio | |
| 2020/0234320 | A1 * | 7/2020 | Dogishi | G05D 1/0088 |
| 2021/0039258 | A1 | 2/2021 | Meyers et al. | |
| 2021/0133496 | A1 | 5/2021 | Barnehama et al. | |

OTHER PUBLICATIONS

Lenchner et al., "Towards Data Center Self-Diagnosis Using a Mobile Robot", http://citeseerx.ist.psu.edu/viewdoc/download?doi=10.1.1.306.3679&rep=rep1&type=pdf retrieved on Jun. 14, 2011, 10 pages.

Mansley et al., "Robotic Mapping and Monitoring of Data Centers", http://citeseerx.ist.psu.edu/viewdoc/download?doi=10.1.1.710.7458&rep=rep1&type=pdf retrieved on May 9, 2011, 6 pages.

Borrmann et al., "A mobile robot based system for fully automated thermal 3D mapping", Advanced Engineering Informatics, https://vdocuments.net/download/a-mobile-robot-based-system-for-fully-automated-thermal-3d-mapping retrieved on Jun. 10, 2014, 16 pages.

Russo et al., "A Novel Cloud-Based Service Robotics Application to Data Center Environmental Monitoring", MDPI Sensors, https://www.ncbi.nlm.nih.gov/pmc/articles/PMC5017420/ retrieved on Aug. 8, 2016, 18 pages.

Branscombe, "This Robot Monitors Data Center Cooling Behind Closed Cabinet Doors", https://www.datacenterknowledge.com/design/robot-monitors-data-center-cooling-behind-closed-cabinet-doors retrieved on Feb. 27, 2018, 6 pages.

Rosa et al., "Towards A ROS-Based Autonomous Cloud Robotics Platform for Data Center Monitoring", http://stefanorosa.it/preprints/etfa2014.pdf retrieved on Dec. 31, 2014, 8 pages.

English Abstract for CN208312637 retrieved on Espacenet on Aug. 23, 2023.

* cited by examiner

ROBOT-ASSISTED MONITORING OF POTENTIAL HEAT ANOMALIES IN A DATACENTER RACK ASSEMBLIES

CROSS REFERENCE

The present application claims priority to EP Application No. 22306284.5, filed Aug. 30, 2022 entitled "Robot-Assisted Monitoring of Potential Heat Anomalies in Datacenter Rack Assemblies", the entirety of which is incorporated herein by reference.

FIELD OF TECHNOLOGY

The present technology generally relates to the monitoring of heat generation in a computing facility datacenter and, more particularly, to a mobile robot-assisted thermal monitoring system configured to determine and monitor points of interest (POIs) of a datacenter environment that may be susceptible to heat anomalies.

BACKGROUND

Datacenters provide computing facilities that service operational processing needs of a wide variety of local and global customers. As such, datacenters implement a vast number of rack-mounted computer processing systems, e.g., computer servers and associated electronic processing equipment that, depending on the scale of customer activity, can range from hundreds to thousands of such computer systems. Typically, for maintenance accessibility and air flow ventilation reasons, datacenters house the computer processing systems within rack assemblies that are organized into a series of spaced rows of racks arranged in parallel that are separated by an aisle space disposed in between each row of racks.

In most instances, the rack-mounted computer servers and associated electronic processing equipment are in continuous operating modes. As such, the corresponding processing electronic components typically generate significant amounts of thermal energy, i.e., heat, that needs to be monitored to determine potential heat-related anomalies that may lead to component failures.

However, the timely determination of heat-related anomalies of rack assemblies amongst hundreds to thousands of rack assemblies within a datacenter presents certain logistical issues. Accordingly, there exists some interest in the timely, efficient, and practical determination of datacenter rack assemblies that are susceptible to potential heat-related anomalies.

SUMMARY

It is an object of the present technology to ameliorate at least some of the noted issues experienced by conventional thermal monitoring approaches of rack assemblies in datacenters.

According to an objective of the present technology, there is provided a mobile robot-assisted thermal monitoring system for points-of-interest (POIs) in a datacenter, that comprises at least one thermal sensor configured to generate environmental temperature data of a location within the datacenter; a plurality of power distribution units (PDUs) configured to generate electrical power consumption data of servers operated in the datacenter; and a mobile robot comprising a system manager controller configured to control operations of the mobile robot so as to cause the mobile robot to navigate throughout the datacenter, and one or more thermal cameras, in communication with the system manager controller, configured to capture a plurality of surface temperature images of at least one of the POIs.

The thermal monitoring system further comprises a datacenter operations controller, in communication with the system manager controller of the mobile robot, that is configured to receive the plurality of surface temperature images of the at least one of the POIs; determine a potential anomalous thermal condition of the at least one of the POIs based on a correlation between at least one of the plurality of surface temperature images of a given POI and at least one of: (i) the environmental temperature data in a vicinity of the given POI, and (ii) the electrical power consumption data of servers located at the POI or in the vicinity of the given POI.

Additional aspects of the present system technology include the determination of the potential anomalous thermal condition based on generating a temperature gradient profile associated with the given POI based on the first surface temperature image and the second surface temperature image, in which the temperature gradient profile determines a rate of temperature change between the first time instance and the second time instance; and comparing the temperature gradient profile of the given POI with a look-up table, the look-up table comprising a set of correlations between the environmental temperature data, the electrical power consumption data, and expected temperatures of POIs. The look-up table further comprising an action item that provides one of the following: (i) an indication of acceptable operations, (ii) an instruction to capture new surface temperature images of the given POI, (iii) an alert notification of the given POI, or (iv) an instruction to power down server(s) corresponding to the given POI as well as respectively assigning different weighting factors to the environmental temperature data and the electrical power consumption data.

In some examples of the mobile robot-assisted thermal monitoring system, the plurality of surface temperature images comprises capturing a first surface temperature image of the given POI at a first time instance; and capturing a second surface temperature image of the given POI at a second time instance that is later than the first time instance.

In some examples of the mobile robot-assisted thermal monitoring system, the determining of the potential anomalous thermal condition comprises generating a temperature gradient profile associated with the given POI based on the first surface temperature image and the second surface temperature image, in which the temperature gradient profile determines a rate of temperature change between the first time instance and the second time instance; and comparing the temperature gradient profile of the given POI with a look-up table, the look-up table comprising a set of correlations between the environmental temperature data, the electrical power consumption data, and expected temperatures of POIs.

In some examples of the mobile robot-assisted thermal monitoring system, the determining of the potential anomalous thermal condition further comprises at least one of: (i) a change in the environmental temperature data of the given POI from past temperature data based on the temperature gradient profile, and (ii) an inconsistency between the environmental temperature data of the given POI and the power consumption data based on the temperature gradient profile.

In some examples of the mobile robot-assisted thermal monitoring system, the look-up table further comprises an action item that provides one of the following: (i) an indication of acceptable operations, (ii) an instruction to capture new surface temperature images of the given POI, (iii) an alert notification of the given POI, or (iv) an instruction to power down server(s) corresponding to the given POI.

In some examples of the mobile robot-assisted thermal monitoring system, the set of correlations of the look-up table incorporate different weighting factors that are respectively assigned to the environmental temperature data and the electrical power consumption data.

In some examples of the mobile robot-assisted thermal monitoring system, the at least one thermal sensor is positioned at a plurality of locations within the datacenter (10).

In some examples of the mobile robot-assisted thermal monitoring system, the at least one thermal sensor is mounted on the mobile robot.

In some examples of the mobile robot-assisted thermal monitoring system, the navigation of the mobile robot throughout the datacenter to capture the surface temperature images of the at least one of the POIs is based on: (i) a randomized transit route, or (ii) a predetermined transit route directed towards the at least one of the POIs.

In some examples of the mobile robot-assisted thermal monitoring system, the predetermined transit route directed towards the at least one of the POIs is based on at least one of: (i) the environmental temperature data in a vicinity of the given POI, and (ii) the electrical power consumption data of servers located at the POI or in the vicinity of the given POI.

In some examples of the mobile robot-assisted thermal monitoring system, the environmental temperature data, the electrical power consumption data, the temperature gradient profile, and the look-up table are stored in a database communicatively coupled to the datacenter operations controller.

According to another aspect of the present technology, there is provided a method of monitoring thermal conditions for points-of-interest (POIs) in a datacenter, that comprises accessing environmental temperature data of a location within the datacenter provided by at least one thermal sensor, accessing electrical power consumption data of servers operating in the datacenter provided by a plurality of power distribution units (PDUs), accessing a plurality of surface temperature images of at least one of the POIs captured by one or more thermal cameras of a mobile robot navigating throughout the datacenter, and determining, by a datacenter operations controller, a potential anomalous thermal condition of the at least one of the POIs based on a correlation between at least one of the plurality of surface temperature images of a given POI and at least one of: (i) the environmental temperature data in a vicinity of the given POI, and (ii) the electrical power consumption data of servers located at the POI or in the vicinity of the given POI.

Additional aspects of the present method technology include generating a temperature gradient profile associated with the given POI based on the first surface temperature image and the second surface temperature image, in which the temperature gradient profile determines a rate of temperature change between the first time instance and the second time instance, and comparing the temperature gradient profile of the given POI with a look-up table, the look-up table comprising a set of correlations between the environmental temperature data, the electrical power consumption data, and expected temperatures of POIs.

In some examples of the method, the plurality of surface temperature images comprises capturing a first surface temperature image of the given POI at a first time instance; and capturing a second surface temperature image of the given POI at a second time instance that is later than the first time instance.

In some examples of the method, the determining of the potential anomalous thermal condition comprises generating a temperature gradient profile associated with the given POI based on the first surface temperature image and the second surface temperature image, in which the temperature gradient profile determines a rate of temperature change between the first time instance and the second time instance; and comparing the temperature gradient profile of the given POI with a look-up table, the look-up table comprising a set of correlations between the environmental temperature data, the electrical power consumption data, and expected temperatures of POIs.

In some examples of the method, the determining of the potential anomalous thermal condition further comprises at least one of: (i) identifying a change in the environmental temperature data of the given POI from past temperature data based on the temperature gradient profile, and (ii) identifying an inconsistency between the environmental temperature data of the given POI and the power consumption data based on the temperature gradient profile.

In some examples of the method, the look-up table further comprises providing an action item for one of the following: (i) an indication of acceptable operations; (ii) an instruction to capture new surface temperature images of the given POI; (iii) an alert notification of the given POI; or (iv) an instruction to power down server(s) corresponding to the given POI.

In some examples of the method, the set of correlations of the look-up table further comprises respectively assigning different weighting factors to the environmental temperature data and the electrical power consumption data.

In some examples of the method, the navigation of the mobile robot throughout the datacenter to capture the surface temperature images of the at least one of the POIs is based on providing: (i) a randomized transit route, or (ii) a predetermined transit route directed towards the at least one of the POIs.

In some examples of the method, the predetermined transit route directed towards the at least one of the POIs is based on at least one of: (i) the environmental temperature data in a vicinity of the given POI, and (ii) the electrical power consumption data of servers located at the POI or in the vicinity of the given POI.

In some examples of the method, the method further comprises storing the environmental temperature data, the electrical power consumption data, the temperature gradient profile, and the look-up table in a database that is communicatively coupled to the datacenter operations controller.

According to yet another aspect of the present technology, there is provided a system for monitoring thermal conditions of servers in a datacenter, the system comprising a processor and a memory storing a plurality of executable instructions which, when executed by the processor, cause the system to perform the method.

According to yet another aspect of the present technology, there is provided a non-transitory computer-readable medium comprising computer-readable instructions that, upon being executed by a system, cause the system to perform the method.

Implementations of the present technology each have at least one of the above-mentioned objects and/or aspects, but do not necessarily list all of them. It should be understood that some aspects of the present technology that have resulted from attempting to attain the above-mentioned object may not satisfy this object and/or may satisfy other objects not specifically recited herein.

Additional and/or alternative features, aspects and advantages of implementations of the present technology will become apparent from the following description, the accompanying drawings and the appended claims.

BRIEF DESCRIPTION OF THE DRAWINGS

For a better understanding of the present technology, as well as other aspects and further features thereof, reference is made to the following description which is to be used in conjunction with the accompanying drawings, where.

Figure 1:
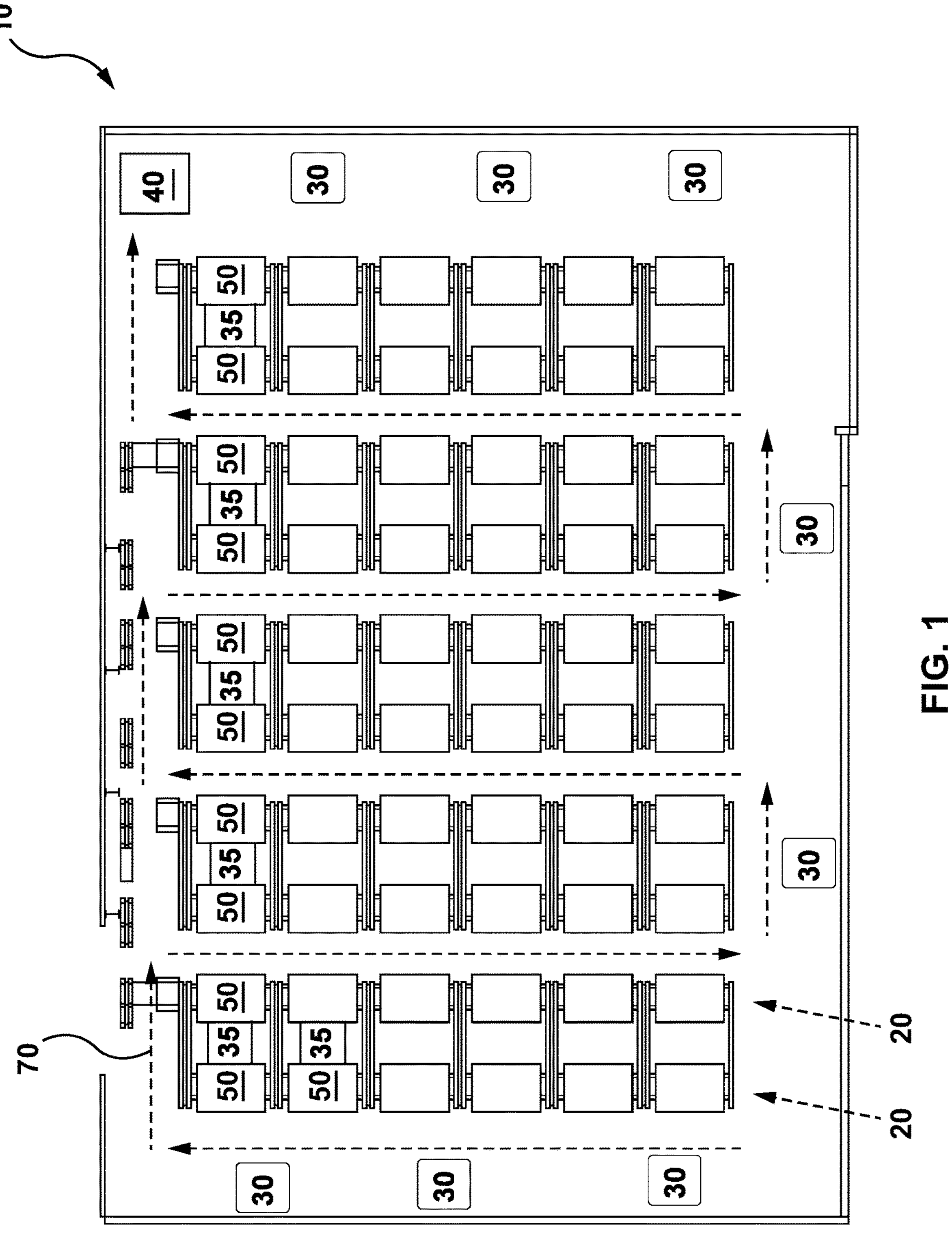
FIG. 1 schematically depicts a top elevation view of rack-mounted assembly arrangements within a datacenter environment.

Unless otherwise indicated, it should be noted that the figures may not be drawn to scale. Moreover, in the context of the present disclosures, unless expressly provided otherwise, the words "first", "second", "third", "front", "rear", "top", "bottom", "left", "right", "upward", "downward", etc. have been used as descriptive adjectives only for the purpose of providing a clear description of the present technology and in no way are intended to be limiting in regard to orientation.

In the context of the present disclosures, unless expressly provided otherwise, electronic equipment may refer, but is not limited to, "servers", "electronic devices", "operation systems", "systems", "computer-based systems", "controller units", "monitoring devices", "electronic processing assemblies", "control devices" and/or any combination thereof appropriate to the relevant task at hand.

Implementations of the present technology each have at least one of the above-mentioned objects and/or aspects, but do not necessarily have all of them. It should be understood that some aspects of the present technology that have resulted from attempting to attain the above-mentioned object may not satisfy this object and/or may satisfy other objects not specifically recited herein.

Additional and/or alternative features, aspects and advantages of implementations of the present technology will become apparent from the following description, the accompanying drawings and the appended claims.

DETAILED DESCRIPTION

The examples and conditional language recited herein are principally intended to aid the reader in understanding the principles of the present technology and not to limit its scope to such specifically recited examples and conditions. It will be appreciated that those skilled in the art may devise various arrangements that, although not explicitly described or shown herein, nonetheless embody the principles of the present technology.

Furthermore, as an aid to understanding, the following description may describe relatively simplified implementations of the present technology. As persons skilled in the art would understand, various implementations of the present technology may be of a greater complexity.

In some cases, what are believed to be helpful examples of modifications to the present technology may also be set forth. This is done merely as an aid to understanding, and, again, not to define the scope or set forth the bounds of the present technology. These modifications are not an exhaustive list, and a person skilled in the art may make other modifications while nonetheless remaining within the scope of the present technology. Further, where no examples of modifications have been set forth, it should not be interpreted that no modifications are possible and/or that what is described is the sole manner of implementing that element of the present technology.

Moreover, all statements herein reciting principles, aspects, and implementations of the present technology, as well as specific examples thereof, are intended to encompass both structural and functional equivalents thereof, whether they are currently known or developed in the future.

Thus, for example, it will be appreciated by those skilled in the art that any block diagrams herein represent conceptual views of illustrative circuitry embodying the principles of the present technology. Similarly, it will be appreciated that any flowcharts, flow diagrams, state transition diagrams, pseudo-code, and the like represent various processes that may be substantially represented in non-transitory computer-readable media and so executed by a computer or processor, whether or not such computer or processor is explicitly shown.

The functions of the various elements shown in the figures, including any functional block labeled as a "processor" or "processing unit", may be provided through the use of dedicated hardware as well as hardware capable of executing software in association with appropriate software. When provided by a processor, the functions may be provided by a single dedicated processor, by a single shared processor, or by a plurality of individual processors, some of which is may be shared. In some implementations of the present technology, the processor may be a general-purpose processor, such as a central processing unit (CPU) or a processor dedicated to a specific purpose, such as a digital signal processor (DSP). Moreover, explicit use of the term a "processor" should not be construed to refer exclusively to hardware capable of executing software, and may implicitly include, without limitation, application specific integrated circuit (ASIC), field programmable gate array (FPGA), read-only memory (ROM) for storing software, random access memory (RAM), and non-volatile storage. Other hardware, conventional and/or custom, may also be included.

Software modules, or simply modules which are implied to be software, may be represented herein as any combination of flowchart elements or other elements indicating performance of process steps and/or textual description. Such modules may be executed by hardware that is expressly or implicitly shown. Moreover, it should be understood that module may include for example, but without being limitative, computer program logic, computer program instructions, software, stack, firmware, hardware circuitry or a combination thereof which provides the required capabilities.

In the present description, various terms relating to spatial orientation such as "front", "rear", "top", "bottom", "left", "right", "upward", "downward", etc. are described relative forward, up-right motion of the robot of the present technology according to standard operation. However, it is understood that these terms are merely used to improve the clarity of the description and in no way are meant to be limiting in regard to orientation or form thereof.

In the context of the present specification, a "server" is a computer program that is running on appropriate hardware and is capable of receiving requests (e.g., from client devices) over a network, and carrying out those requests, or causing those requests to be carried out. The hardware may be one physical computer or one physical computer system, but neither is required to be the case with respect to the present technology. In the present context, the use of the expression a "server" is not intended to mean that every task (e.g., received instructions or requests) or any particular task will have been received, carried out, or caused to be carried out, by the same server (i.e., the same software and/or hardware); it is intended to mean that any number of software elements or hardware devices may be involved in receiving/sending, carrying out or causing to be carried out any task or request, or the consequences of any task or request; and all of this soft-ware and hardware may be one server or multiple servers, both of which are included within the expression "at least one server".

In the context of the present specification, "user device" is any computer hardware that is capable of running software appropriate to the relevant task at hand. Thus, some (non-limiting) examples of user devices include personal computers (desktops, laptops, netbooks, etc.), smartphones, and tablets, as well as network equipment such as routers, switches, and gateways. It should be noted that a device acting as a user device in the present context is not precluded from acting as a server to other user devices. The use of the expression "a user device" does not preclude multiple user devices being used in receiving/sending, carrying out or causing to be carried out any task or request, or the consequences of any task or request, or steps of any method described herein.

In the context of the present specification, a "database" is any structured collection of data, irrespective of its particular structure, the database management software, or the computer hardware on which the data is stored, implemented or otherwise rendered available for use. A database may reside on the same hardware as the process that stores or makes use of the information stored in the database or it may reside on separate hardware, such as a dedicated server or plurality of servers.

In the context of the present specification, the expression "dataset" includes information of any nature or kind whatsoever capable of being stored in a database. Thus information includes, but is not limited to audiovisual works (images, movies, sound records, presentations etc.), data (location data, numerical data, etc.), text (opinions, comments, questions, messages, etc.), documents, spreadsheets, lists of words, etc.

In the context of the present specification, the expression "component" is meant to include software (appropriate to a particular hardware context) that is both necessary and sufficient to achieve the specific function(s) being referenced.

In the context of the present specification, the expression "computer usable information storage medium" is intended to include media of any nature and kind whatsoever, including RAM, ROM, disks (CD-ROMs, DVDs, floppy disks, hard drivers, etc.), USB keys, solid state-drives, tape drives, etc.

In the context of the present specification, unless expressly provided otherwise, an "indication" of an information element may be the information element itself or a pointer, reference, link, or other indirect mechanism enabling the recipient of the indication to locate a network, memory, database, or other computer-readable medium location from which the information element may be retrieved. For example, an indication of a document could include the document itself (i.e. its contents), or it could be a unique document descriptor identifying a data object with respect to a particular object storage device, or some other means of directing the recipient of the indication to a network location, memory address, database table, or other location where the data object may be accessed. As one skilled in the art would recognize, the degree of precision required in such an indication depends on the extent of any prior understanding about the interpretation to be given to information being exchanged as between the sender and the recipient of the indication. For example, if it is understood prior to a communication between a sender and a recipient that an indication of an information element will take the form of a database key for an entry in a particular table of a predetermined database containing the information element, then the sending of the database key is all that is required to effectively convey the information element to the recipient, even though the information element itself was not transmitted as between the sender and the recipient of the indication.

Aspects of the inventive concepts, as provided by the embodiments of the present disclosure, are directed to a mobile robot-assisted thermal monitoring system and method configured to determine and monitor points of interest (POIs) of a datacenter environment that may be susceptible to heat anomalies.

With these fundamental principles in place, we will now consider some non-limiting examples to illustrate various implementations of aspects of the present disclosure.

By way of context, FIG. 1 schematically depicts a top elevation view of the server rack assembly arrangements within a datacenter environment 10. In the representative nonlimiting example illustrated by FIG. 1, the datacenter environment 10 implements a plurality of rows 20 comprising server racks 50, in which each server rack 50 supports and services a plurality of computer servers (not shown) comprising associated electronic processing equipment (not shown), as well as coupled power distribution units (PDUs) 35 configured to monitor and communicate the electric power consumed by the electronic processing equipment or servers housed by the server racks 50. The PDUs 35 may be located within the server racks 50 or outside the server racks 50 as depicted in FIG. 1.

Moreover, as shown in the representative nonlimiting example of the datacenter environment 10, ten server rack rows 20 are provided with each server rack row 20 comprising six server racks 50. The ten server rack rows 20 may be grouped into five pairs of juxtaposed rows 20, such that the paired rows 20 within each group form a warm alley therebetween while cold alleys are formed between the groups of paired rows 20. As will be described in detail below, the cold alleys allow for a transit path 70, in which a mobile robot 100 can navigate and travel through the datacenter environment 10 during heat monitoring operations of the server racks 50.

The datacenter environment 10 may also incorporate a plurality of remote thermal sensors 30 that are positioned within various locations of the datacenter 10. The remote thermal sensors 30 are configured to detect and measure the environmental temperature radiated within zones covering server racks 50 within the vicinity of the locations. In other embodiments, one or more thermal sensors 30 may be mounted on the mobile robot 100 to provide the closer detection and measurement of the environmental temperature of the server racks 50.

The datacenter environment 10 may further implement a datacenter operations controller 40 responsible for the overall supervision of datacenter environment 10 operations and communications. As will be described in detail below, the datacenter operations controller 40 is configured to communicate with, and process the data received from, inter alia, the remote thermal sensors 30, the PDUs 35, and the mobile robot 100. In certain nonlimiting embodiments, such communications may be realized by wireless (e.g., WiFi) communication facilities.

It will be appreciated that the datacenter operations controller 40 may embody a processing unit (not shown) for carrying out executable code and a memory unit (not shown) that stores, inter alia, databases and executable code in a non-transitory medium (not shown) included in the memory unit. The processor unit may be a general-purpose processor or may be a specific-purpose processor comprising one or more preprogrammed hardware or firmware elements (e.g., application-specific integrated circuits (ASICs), electrically erasable programmable read-only memories (EEPROMs), etc.) or other related elements configured to execute the processing of received data and generate operational instructions to corresponding entities.

Figure 2:
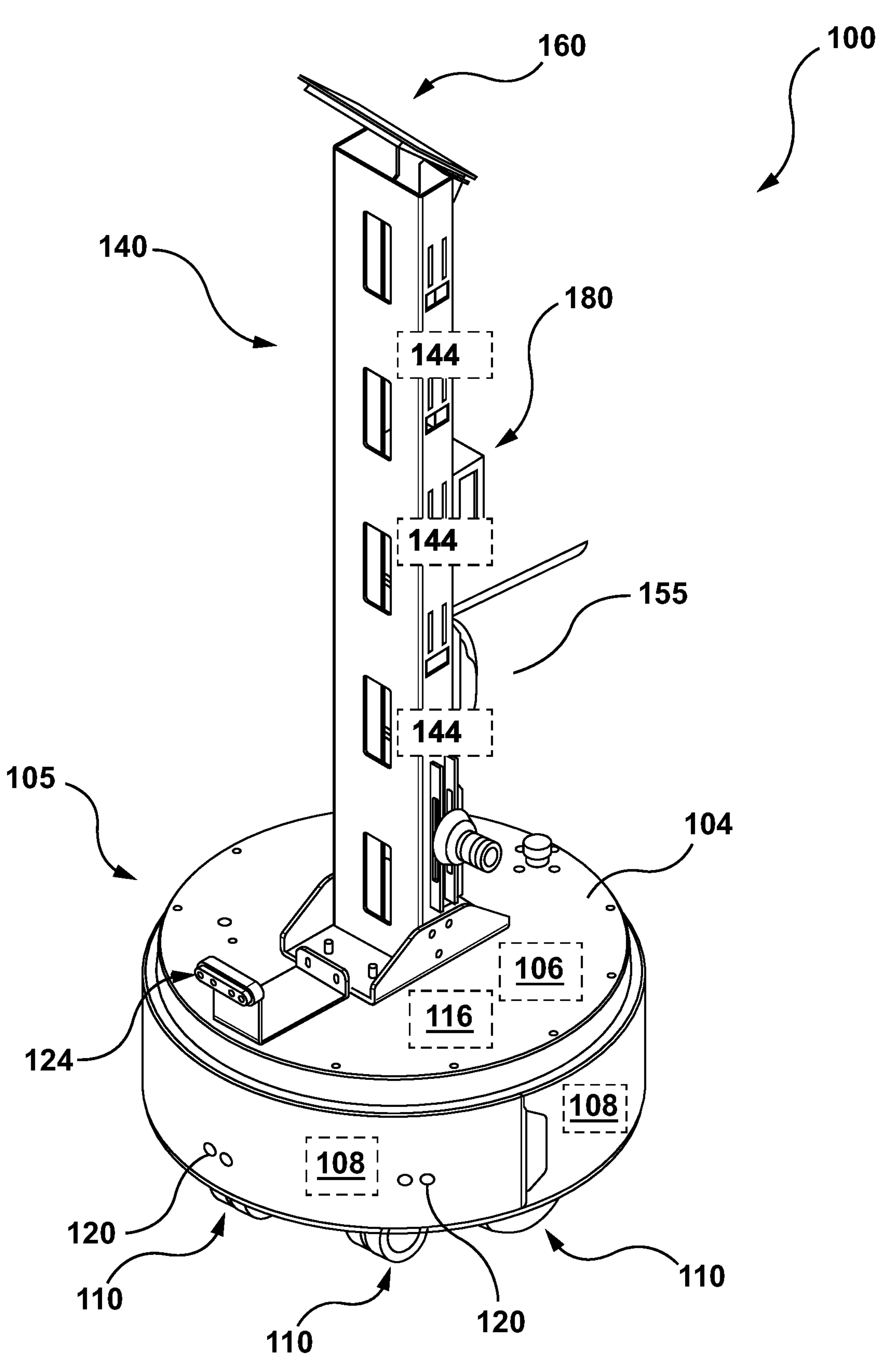
FIGS. 2 to 4 depict a mobile robot configuration with thermal detection capabilities, in accordance with an embodiment of the present technology.
Figure 3:
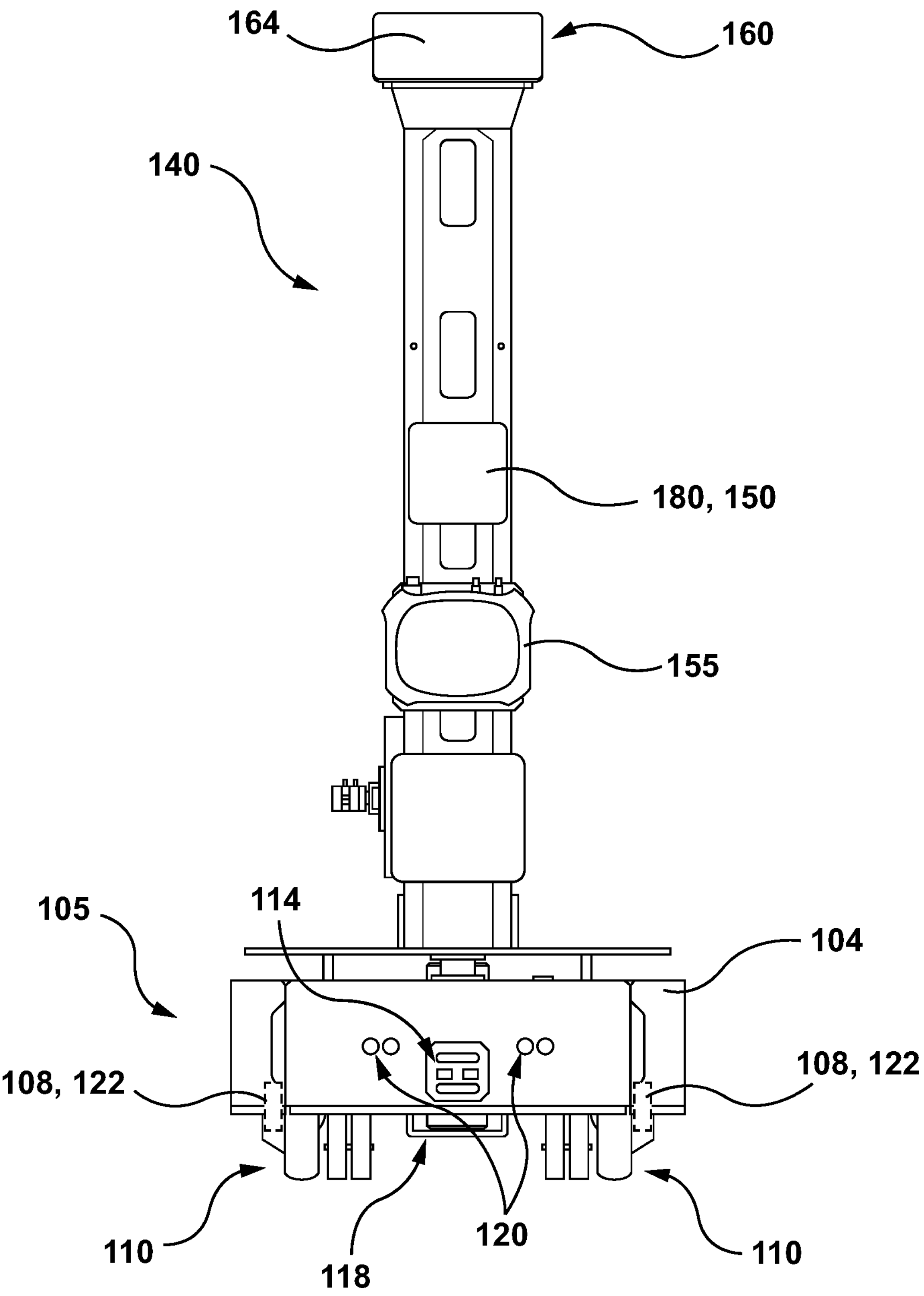
Figure 4:
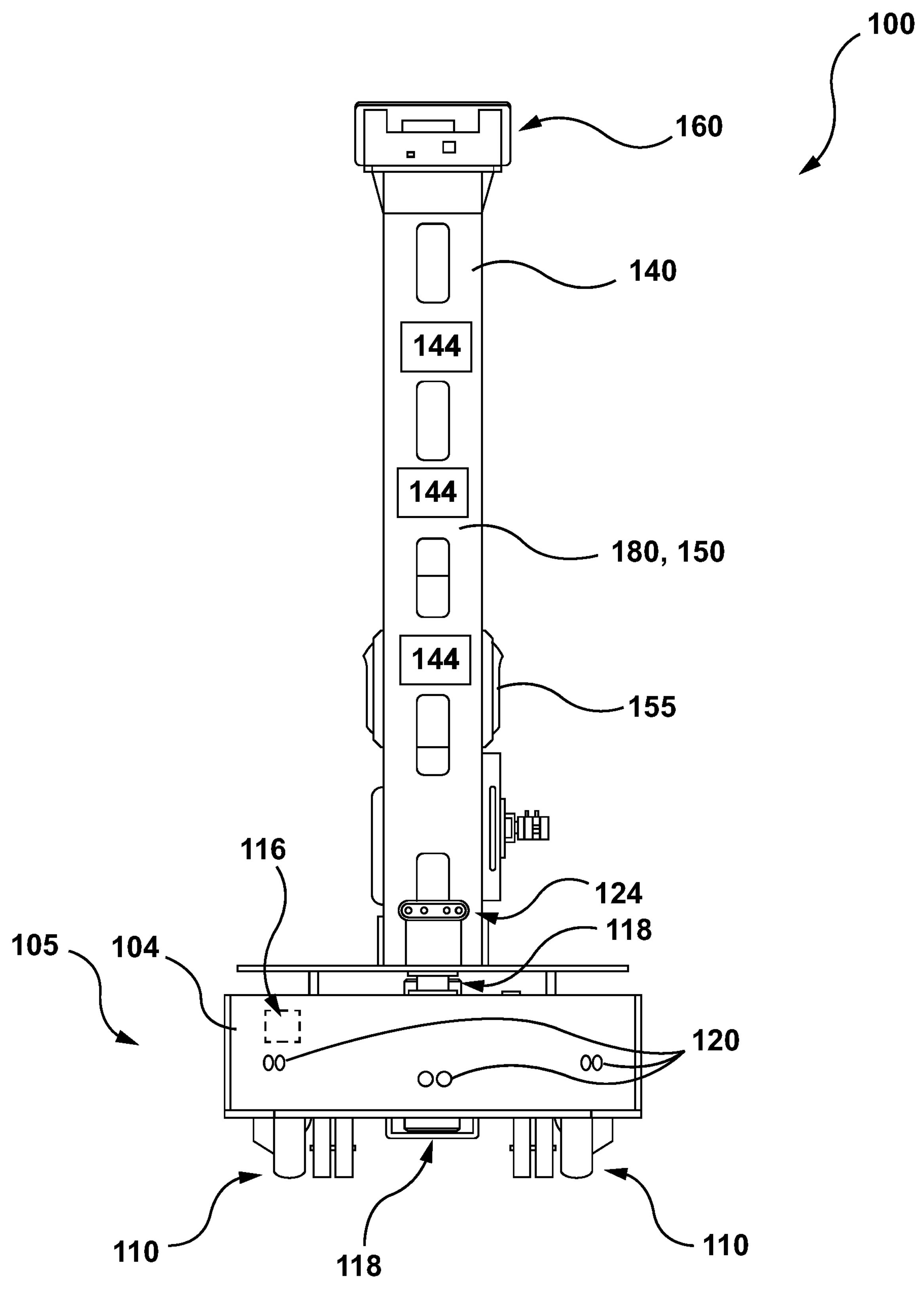

FIGS. 2 to 4 depicts a mobile robot 100 configuration having thermal detection capabilities, in accordance with an embodiment of the present technology. As shown, mobile robot 100 includes a mobile robot base 105 and a post 140 that is attached to and extends in a generally vertical direction upward from the robot base 105.

The robot base 105 is configured to provide a support structure for the post 140 as well as other components that facilitate to actuate the movement of the mobile robot 100 during navigated travel routing paths through datacenter environment 10. In the illustrated embodiment of FIG. 2, the robot base 105 includes a main body 104 that is cylindrically-shaped having a diameter substantially greater than its height for stability purposes. It is contemplated that the main body 104 could be implemented in a variety of different suitable forms.

The robot base 105 includes electric motors 108 (not shown) and a plurality of wheels 110 that are operatively connected to, and engaged by, the motors 108 to be driven thereby. The exact number of motors 108 and wheels 110 may vary between different embodiments and is not meant to be limited by the illustrated arrangement. The robot base 105 also includes a navigation module 112 (best seen in FIG. 3) communicatively coupled to the motors 108 for actuating the mechanical drive systems of the mobile robot 100 for mobilization as well as directing the mobile robot 100 through instructed navigation transit routes 70 of the datacenter environment 10. The instructed navigation transit routes 70 of the mobile robot 100 may be based on a randomized route or a predetermined transit route directed towards a vicinity of particular server racks 50. The robot base 105 further includes a plurality of sensors communicatively connected to the navigation module 112 to provide navigational and environmental information to the navigation module 112. The navigation module 112 may access a computer-generated map of the structure (e.g. of the data center 10) surveyed by the mobile robot 100 to cause the mobile robot 100 to navigate therein.

Among the sensors for managing movement of the mobile robot 100, the base 105 includes an inertial measurement unit (IMU) 116 (shown schematically) communicatively connected to the navigation module 112 and disposed within the base body 104. In the present embodiment, the IMU 116 is formed from a printed circuit board (PCB), MEMS-based gyroscope and three-axis accelerometer (not separately identified), although the specific implementation of the IMU 116 could vary. The IMU 116 measures acceleration, angular speed, and the orientation of the mobile robot 100 in space. The IMU 116 generally includes a signal processing circuit communicatively connected to the navigation module 112 for providing raw or treated spatial or kinetic data to the navigation module 112.

The base 105 includes two LIDAR assemblies 118 communicatively connected to the navigation module 112 for detecting objects and obstacles surrounding the mobile robot 100 in order to map the surroundings for navigation. In the illustrated embodiment, one LIDAR assembly 118 is connected to and disposed in an upper portion of the base body 104 and the other LIDAR assembly 118 is connected to and disposed below the base body 104, but different placement of one or both assemblies 118 are contemplated in different embodiments. In this embodiment, each LIDAR assembly 118 has an imaging region 119 with a 360° lateral field of view and a range of approximately 16 meters. Depending on specific choice of LIDAR assembly, the exact imaging range and/or field of view could vary in different embodiments.

In addition to the LIDAR assemblies 118, the base 105 also includes five ultrasonic sensors 120 communicatively connected to the navigation module 112. The ultrasonic sensors 120 are integrated into the exterior walls of the base body 104, with the ultrasonic sensors 120 being arranged to provide a sensing region 121 with a 360° field of view around the mobile robot 100. For example, the sensing region 121 may have a sensing range of approximately 4 meters from the base 105. The ultrasonic sensors 120 thus provide obstacle detection around the mobile robot 100, although information from the sensors 120 could also be integrated into mapping by the mobile robot 100. Depending on the embodiment, it is contemplated that the number and capabilities of the ultrasonic sensors 120 could vary.

The base 105 further includes wheel encoders 122 (shown schematically) for measuring movement of the wheels 110 in order to monitor distance traveled by the mobile robot 100. Each wheel encoder 122 measures the rotations of a corresponding wheel 110, which provide information on both a distance traveled by each wheel 110 (with the wheel radius being known), as well as the relative movement between wheels 110. The wheel encoders 122 are communicatively connected to the navigation module 112 and disposed in the base body 104. Depending on the embodiment, it is contemplated that the wheel encoders 122 could be omitted in some cases.

The base 105 also includes four infrared sensors 114 communicatively connected to the navigation module 112, via the charging module 106. The infrared sensors 114 are disposed on a forward side of the base 105 in order to sense a small region in front of the mobile robot 100 (when moving in a generally forward direction). In use, an infrared sensing region extends a short distance generally forward from the infrared sensors 114. The infrared sensors 114 serve to detect a charging base (not shown) in the datacenter 10, when in close proximity to said charging base, and to properly position the mobile robot 100 relative to the charging base in order to autonomously connect the mobile robot 100 to the charging base for charging. In at least some embodiments, the infrared sensors 114 could be omitted, disposed on a backward side of the base 105 in order to sense a small region behind the mobile robot 100 (when moving in a generally forward direction) or exchanged for different sensing technology for positioning the mobile robot 100 relative to the charging base.

The base 105 further includes a camera 124, also referred to as a depth camera 124, disposed on a top surface of the base body 104. As will be described further below, the camera 124 provides a live and/or recorded view from a front side of the mobile robot 100 to an operator of the mobile robot 100.

The robot post 140 is configured to support a variety of mounted components of the mobile robot 100. The robot post 140 could be implemented in a variety of forms, such as, for example, in rectangular or cylindrical configurations. It is also contemplated that more than one post 140 could be included in the mobile robot 100, such as, for example, different posts for supporting different interactive components.

The robot post 140 incorporates a plurality of mounted thermal cameras 144 that are vertically mounted at equal distances along the vertical length of the post 140. The thermal cameras 144 employ infrared detectors configured to capture the thermal energy radiated by servers and/or server racks 50 within a corresponding spatial zone area and convert the detected radiated thermal energy into a plurality of surface temperature image data 46.

Figure 5:
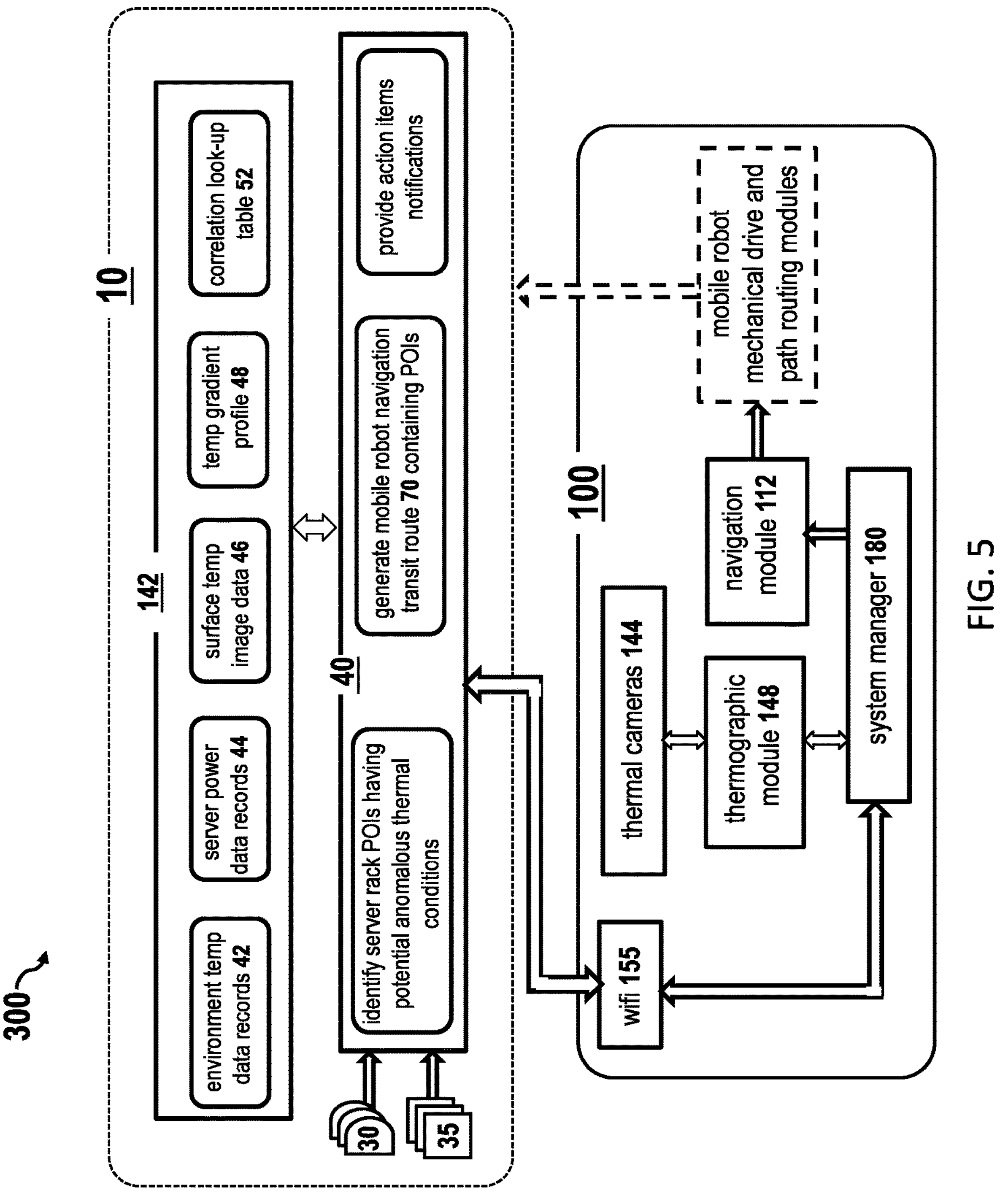
FIG. 5 depicts a mobile robot-assisted thermal monitoring system configured to determine and monitor points of interest (POIs) of a datacenter environment susceptible to heat anomalies, in accordance with an embodiment of the present technology.

In various nonlimiting embodiments, the capture of the thermal energy radiated within the corresponding spatial zone area may be conducted at different instances in time to indicate any changes of the surface temperature image data 46 over time. As such, the plurality of surface temperature image data 46 may be parametrized by location information and corresponding time instances (e.g., hourly, daily, weekly, monthly, seasonally, etc.). The plurality of surface temperature image data 46 may be represented by any suitable form capable of processing, such as, for example, datacenter heat maps, datacenter temperature curve profiles, etc. As shown by FIG. 5, the surface temperature image data 46 may be stored in readily-accessible datacenter operations controller database 142. In addition, the robot post 140 may also incorporate one or more mounted thermal sensors 30 to provide closer detection and measurement of the temperature of the server racks 50.

The mobile robot 100 further incorporates a system manager controller 180. The system manager controller 180 is configured to manage the mechanical driving and navigational routing path operations of the mobile robot 100, in accordance with instructions provided by the datacenter operations controller 40. The system manager controller 180 is further configured to communicate with, inter alia, the datacenter operations controller 40, a thermographic module 148 (best seen in FIG. 5), and a navigation module 112 (best seen in FIG. 5).

It will be appreciated that the system manager controller 180 comprises a processing unit (not shown) for carrying out executable code operatively connected to the system manager controller 180 that stores, inter alia, the executable code in a non-transitory medium (not shown) included in a memory unit (not shown). The processor unit may be a general-purpose processor or may be a specific-purpose processor comprising one or more preprogrammed hardware or firmware elements (e.g., application-specific integrated circuits (ASICs), electrically erasable programmable read-only memories (EEPROMs), etc.) or other related elements. The non-transitory medium of the memory unit may be a semiconductor memory (e.g., read-only memory (ROM) and/or random-access memory (RAM), a magnetic storage medium, an optical storage medium, and/or any other suitable type of memory.

The robot post 140 also incorporates a wireless communication facility 155 (e.g., WiFi antenna/router) communicatively and operatively coupled to the system manager controller 180. The wireless facility 155 is configured to effectuate wireless communications between the mobile robot 100 and the datacenter operations controller system 40 for overall monitoring and operator supervision.

In order to receive commands and provide information to a user in the data center 10, the mobile robot 100 includes a human-machine interface (HMI) 160. The HMI 160 is disposed on a top portion of the post 140. While the HMI 160 is arranged in a position to facilitate interaction by the user, it is contemplated that the HMI 160 could be differently placed on the post 140. The HMI 160 includes a touch screen 164 for presenting information to the user and for receiving touch commands from the user. In some embodiments, it is contemplated that the mobile robot 100 could receive commands only via wireless communication, including but not limited to the Wi-Fi facility 155. In some such cases, the HMI 160 and/or the touchscreen 164.

With this said, FIG. 5 depicts a mobile robot-assisted thermal monitoring system 300 configured to determine and monitor points of interest (POIs) in a datacenter environment 10 that may be susceptible to heat anomalies, in accordance with an embodiment of the present technology. As shown, the mobile robot-assisted thermal monitoring system 300 generally comprises the datacenter operations controller 40 and associated elements along with the mobile robot 100 and associated components.

In particular, the datacenter operations controller 40 is configured to receive the thermal readings of the server racks 50 within the zones corresponding to each of the thermal sensors 30 and coalesce and process the collected thermal readings to generate a datacenter environmental temperature data record 42.

In various nonlimiting embodiments, the environmental temperature data record 42 may be parametrized by location information and corresponding time instances (e.g., hourly, daily, weekly, monthly, seasonally, etc.). The environmental temperature data record 42 may be represented by any suitable form capable of processing, such as, for example, datacenter heat maps, datacenter temperature curve profiles, etc. As shown by FIG. 5, the environmental temperature data record 42 may be stored in readily-accessible datacenter operations controller database 142.

Relatedly, the datacenter operations controller 40 is also configured to receive the electric power data consumed by the electronic processing equipment of each of the server racks 50 from the PDUs 35 and coalesce and process the collected electric power consumption data to generate a server power consumption data record 44. The server power consumption data record 44 may include relevant information for each server housed by the server rack 50, such as, for example the consumed current and voltage data.

In various nonlimiting embodiments, the server power consumption data record 44 may be parametrized by different time instances (e.g., hourly, daily, weekly, monthly, seasonally, etc.). The server power consumption data record 44 may be represented in any suitable form capable of processing, such as, for example, server rack power consumption maps, server rack power consumption curves, etc. As shown by FIG. 5, the server power consumption data record 44 may be stored in readily-accessible datacenter operations controller database 142.

Moreover, as noted above, the capture of the radiated thermal energy by the thermal cameras 144 of mobile robot 100 may be conducted at different time instances to indicate any changes of the surface temperature image data 46 of the corresponding servers and/or server racks 50 over time. Accordingly, in certain nonlimiting embodiments, based on the information provided by the plurality of surface temperature image data 46 captured over time, the datacenter operations controller 40 is further configured to generate a temperature gradient profile 48 that identifies temperature variations of each of the server racks 50 over different time instances (e.g., hourly, daily, weekly, monthly, seasonally, etc.). In particular, the temperature gradient profile 48 may be generated based on the determination of the rate of temperature change between a first surface temperature image captured at a first time instance and a second surface temperature image captured at a second time instance. As shown by FIG. 5, the temperature gradient profile 48 may be stored in readily-accessible datacenter operations controller database 142.

Additionally, datacenter operations controller 40 may contain a correlation look-up table 52 comprising a set of correlations between the environmental temperature data records 42, the server power consumption data records 44, and expected temperature and power consumption operational parameters for the servers and/or server racks 50. The correlation look-up table 52 may also incorporate different weighting factors that are respectively assigned to the environmental temperature data and the electrical power consumption data.

The correlation look-up table 52 may further incorporate action items triggering various notifications to the datacenter operations controller 40 depending on the degree of deviations from the environmental temperature data records 42, the server power consumption data records 44, and expected temperature and power consumption operational parameters for the servers and/or server racks 50. For example, correlation look-up table 52 may provide an indication of acceptable operations by the servers and/or server racks 50, an instruction to capture new surface temperature images of the servers and/or server racks 50 by the mobile robot 100, an alert indicating unacceptable operations by the servers and/or server racks 50, an instruction to immediately power down the server(s), etc.

Therefore, in accordance with certain nonlimiting embodiments, based on the temperature gradient profile 48 indicating temperature variations over time along with the information provided by the correlational look-up table 52, the datacenter operations controller 40 is further configured to determine a potential anomalous thermal condition of one or more of the servers, server racks 50, electric consoles, electric connections, heat exchangers, wires, and/or any other entity on which the controller 40 may determine a potential anomalous thermal condition which, upon such determination, subsequently identifies the relevant entity as a given points-of-interest (POIs). POIs may be identified in the computer-generated map of the data center 10 under the form of a set of POI coordinates. In this embodiment, the set of POI coordinates may be computed using a quaternion (m, n, o, p) and is indicative of a current position of the corresponding POI in the data center relatively to a fixed reference point of the data center 10, and an orientation of the POI relatively to a fixed reference direction. Each POI is associated, by the controller 40, with a POI label including information about an identification of the type of entity (e.g. server, racks, heat exchanger) or a category of the entity on which the potential anomalous thermal condition has been detected. Usage of the quaternion form for the set of POI coordinates may ease computing and calculation applied to said set of POI coordinates.

In use, information about the POIs is stored under the form of a text file (e.g. JSON data format) and retrieved by the controller 40 from a database (e.g. the datacenter operations controller database 142) upon initiating navigation of the mobile robot 100. The text file may be updated during operation of the mobile robot 100 and further retrieved by the controller 40.

The determination of potential anomalous thermal conditions may take into account, for example, a change in the environmental temperature data of the given POI from past temperature data based on the temperature gradient profile 48 and/or an inconsistency between the environmental temperature data of the given POI and the power consumption data based on the temperature gradient profile 46. The datacenter operations controller 40 may then generate a mobile robot navigation transit route 70 defining a path through the datacenter 10 directed to the POI server rack(s) 50, based on, for example, the environmental temperature data of servers or server rack(s) 50 in a vicinity of the given POI, and/or the electrical power consumption data of servers located at the POI or in the vicinity of the given POI. The navigation transit route 70 is subsequently forwarded to the system manager 180 of mobile robot 100 via the wireless communication facility 155 (e.g., WiFi).

In turn, the mobile robot system manager 180 forwards navigation transit route 70 to navigation module 112 to provide operational guidance of the mobile robot 100 to a given POI (e.g. a server rack 50) through the datacenter 10 as well as actuate the mechanical drive systems of the mobile robot 100 for mobilization therethrough. The mobile robot system manager 180 may use the set of POI coordinates and other information associated with the POI to determine a target position and a target orientation of the mobile robot 100 relatively to the POI. The mobile robot system manager 180 also provides instructions to the thermographic module 148 to activate thermal cameras 144 to capture surface temperature image data of the POI. In some embodiments, the navigation module 112 is implemented as a navigation and mapping controller communicably connected to the mobile robot system manager 180.

Upon capturing the surface temperature image data of the POI and, more specifically, of an entity associated with the POI (e.g. a server rack 50), the thermal cameras 144 forward the surface temperature image data to the thermographic module 148 for digital image processing (i.e., denoising, linear filtering, image enhancement, pixelation, etc.). The thermographic module 148 then forwards the processed temperature image data to the mobile robot system manager 180.

The system manager 180 forwards the processed surface temperature image data of POI entity to the datacenter controller 40 via wireless communication facility 155 (e.g., WiFi). In response, the datacenter controller 40 updates the temperature gradient profile 48 with the surface temperature image data of POI entity and stores it in database 142. In the event that the updated temperature gradient profile 48 indicates an actual thermal anomalous condition at the POI entity, the datacenter controller 40 may provide an alert notification for operator intervention to investigate the cause of the actual thermal anomalous condition at the POI entity.

Figure 6:
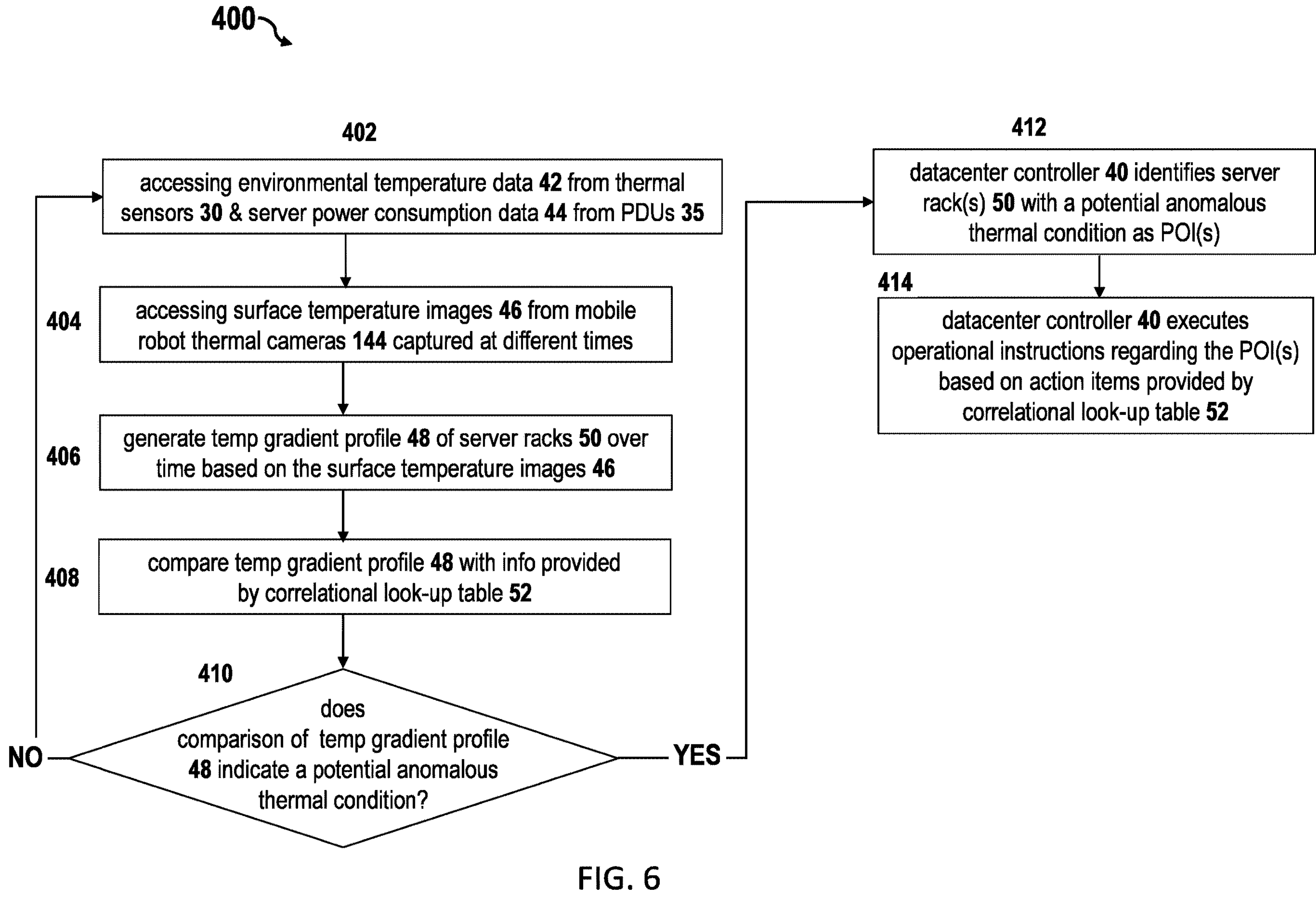
FIG. 6 depicts a functional flow chart of the mobile robot-assisted thermal monitoring processing for determining and monitoring POIs, in accordance with an embodiment of the present technology.

FIG. 6 depicts a functional flow chart of the mobile robot-assisted thermal monitoring process 400 for determining and monitoring POIs, in accordance with an embodiment of the present technology. The process 400 commences at task 402 in which the detected environmental temperature data 42 of the server racks 50 provided by the thermal sensors 30 and the detected server power consumption data 44 provided by the PDUs 35 is accessed.

At task 404, the detected surface temperature images 46 from mobile robot thermal cameras 144 captured at different times is accessed. As discussed above, the capture of the surface temperature image data 46 by the thermal cameras 144 of mobile robot 100 may be conducted at different time instances to indicate any changes of the surface temperature image data 46 of the corresponding servers and/or server racks 50 over time.

At task 406, the datacenter operations controller 40 generates a temperature gradient profile 48 that identifies temperature variations of each of the server racks 50 over different time instances based on the surface temperature image data 46.

In turn, at task 408, the temperature gradient profile 48 is compared to the information provided by the correlational look-up table 52. As discussed above, the correlational look-up table 52 comprises a set of correlations between the environmental temperature data records 42, the server power consumption data records 44, and expected temperature and power consumption operational parameters for the servers and/or server racks 50. The correlation look-up table 52 further incorporates action items triggering various notifications to the datacenter operations controller 40, such as, for example, an indication of acceptable operations by the servers and/or server racks 50, an instruction to capture new surface temperature images of the servers and/or server racks 50 by the mobile robot 100, an alert indicating unacceptable operations by the servers and/or server racks 50, an instruction to immediately power down the server(s), etc.

The process 400 proceeds to task 410, in which a determination is made as to whether the comparison between the temperature gradient profile 48 and the correlational look-up table 52 indicate a potential anomalous thermal condition. As noted above, a potential anomalous thermal condition may be based on a change in the environmental temperature data of servers and/or server racks 50 from past temperature data based on temperature gradient profile 48 indications and/or an inconsistency between the environmental temperature data of the servers and/or server racks 50 and the power consumption data based on the temperature gradient profile 46 indications.

In the event that task 410 determines that no potential thermal anomalous condition exists, process 400 returns back to task 402. However, if task 410 determines that a potential thermal anomalous condition exists, then process 400 advances to task 412 where the datacenter controller 40 identifies the related servers and/or server racks 50 as POIs.

Based upon the identification of POIs, at task 412 the datacenter controller 40 executes operational instructions regarding the POIs. That is, depending on the degree of the potential anomalous condition, the datacenter controller 40 executes instructions reporting acceptable operations by the servers and/or server racks 50, instructions directing the mobile robot 100 to capture new surface temperature images of the servers and/or server racks 50, instructions to provide an alert to operators indicating unacceptable operations by the servers and/or server racks 50, and/or instructions to operators to immediately power down the related server(s) and/or server racks 50.

Therefore, as presented herein, the disclosed embodiments provide a system and method directed to a mobile robot-assisted thermal monitoring system and method configured to determine and monitor points of interest (POIs) of a datacenter environment that may be susceptible to heat anomalies.

Modifications and improvements to the above-described implementations of the present technology may become apparent to those skilled in the art. The foregoing description is intended to be exemplary rather than limiting. The scope of the present technology is therefore intended to be limited solely by the scope of the appended claims.

What is claimed is:

1. A mobile robot-assisted thermal monitoring system for points-of-interest (POIs) in a datacenter, comprising:
- at least one thermal sensor configured to generate environmental temperature data of a location within the datacenter;
- a plurality of power distribution units (PDUs) configured to generate electrical power consumption data of servers operated in the datacenter;
- a mobile robot comprising:
  - a system manager controller configured to control operations of the mobile robot so as to cause the mobile robot to navigate throughout the datacenter via a transit route directed towards a POI, of the POIs in the datacenter, and
  - one or more thermal cameras, in communication with the system manager controller, configured to capture a plurality of surface temperature images of the POI by:
    - capturing a first surface temperature image of the POI at a first time instance; and
    - capturing a second surface temperature image of the POI at a second time instance that is later than the first time instance; and
- a datacenter operations controller, in communication with the system manager controller of the mobile robot, configured to:
  - receive the plurality of surface temperature images of the POI;
  - determine a potential anomalous thermal condition of the POI based on a correlation between at least one of the plurality of surface temperature images of the POI and at least one of: (i) the environmental temperature data, and (ii) the electrical power consumption data, the correlation being identified based on a correlation look-up table comprising a set of correlations between the environmental temperature data, the electrical power consumption data, and expected temperatures of the POI,
- wherein, in the determining of the potential anomalous thermal condition, the mobile robot-assisted thermal monitoring system is further configured to:
  - generate a temperature gradient profile associated with the POI based on the first surface temperature image and the second surface temperature image, in which the temperature gradient profile determines a rate of temperature change between the first time instance and the second time instance;
  - compare the temperature gradient profile associated with the POI with the correlation look-up table, a potential anomalous thermal condition being identified based on a change in the environmental temperature data from past temperature data based on the temperature gradient profile and/or an inconsistency between the environmental temperature data and the electrical power consumption data based on the temperature gradient profile; and cause at least one server corresponding to the POI to power down based on the temperature gradient profile.

2. The mobile robot-assisted thermal monitoring system of claim 1, wherein the correlation look-up table further comprises an action item that provides one of the following: (i) an indication of acceptable operations, (ii) an instruction to capture new surface temperature images of the POI, or (iii) an alert notification of the POI.

3. The mobile robot-assisted thermal monitoring system of claim 1, wherein the electrical power consumption data comprises electrical power consumption data of servers associated with the POI.

4. The mobile robot-assisted thermal monitoring system of claim 1, wherein the transit route is generated based on the environmental temperature data or the electrical power consumption data.

5. The mobile robot-assisted thermal monitoring system of claim 1, wherein the transit route comprises a randomized transit route or a predetermined transit route directed towards the POI.

6. The mobile robot-assisted thermal monitoring system of claim 5, wherein the predetermined transit route directed towards the POI is determined based on the electrical power consumption data of the at least one server corresponding to the POI.

7. A method of monitoring thermal conditions for points-of-interest (POIs) in a datacenter, comprising:

accessing environmental temperature data of a location within the datacenter provided by at least one thermal sensor;

accessing electrical power consumption data of servers operating in the datacenter provided by a plurality of power distribution units (PDUs);

accessing a plurality of surface temperature images of a POI, of the POIs, captured by one or more thermal cameras of a mobile robot navigating throughout the datacenter via a transit route directed towards the POI, a capture of the plurality of surface temperature images comprising:

capturing a first surface temperature image of the POI at a first time instance; and capturing a second surface temperature image of the POI at a second time instance that is later than the first time instance;

determining, by a datacenter operations controller, a potential anomalous thermal condition of the POI based on a correlation between at least one of the plurality of surface temperature images of the POI and at least one of: (i) the environmental temperature data, and (ii) the electrical power consumption data, the method of determining of the potential anomalous thermal condition further comprises:

generating a temperature gradient profile associated with the POI based on the first surface temperature image and the second surface temperature image, in which the temperature gradient profile determines a rate of temperature change between the first time instance and the second time instance;

comparing the temperature gradient profile of the POI with a correlation look-up table comprising a set of correlations between the environmental temperature data, the electrical power consumption data, and expected temperatures of the POIs, a potential anomalous thermal condition being identified based on a change in the environmental temperature data from past temperature data based on the temperature gradient profile and/or an inconsistency between the environmental temperature data and the electrical power consumption data based on the temperature gradient profile; and causing at least one server corresponding to the POI to power down based on the temperature gradient profile.

8. The method of monitoring thermal conditions of claim 7, wherein the correlation look-up table further comprises providing an action item for one of the following: (i) an indication of acceptable operations; (ii) an instruction to capture new surface temperature images of the POI; or (iii) an alert notification of the POI.

9. The method of monitoring thermal conditions of claim 7, wherein the set of correlations of the correlation look-up table further comprises respectively assigning different weighting factors to the environmental temperature data and the electrical power consumption data.

10. The method of claim 7, wherein the electrical power consumption data comprises electrical power consumption data of servers associated with the POI.

11. The method of monitoring thermal conditions of claim 7, wherein the transit route is generated based on the environmental temperature data or the electrical power consumption data.

12. The method of monitoring thermal conditions of claim 7, wherein the transit route comprises a randomized transit route or a predetermined transit route directed towards the POI.

13. The method of monitoring thermal conditions of claim 12, wherein the predetermined transit route directed towards the POI is based on the electrical power consumption data of the at least one server corresponding to the POI.

14. A non-transitory computer-readable medium comprising:

computer-readable instructions that, upon being executed by at least one processor, cause the at least one processor to:

access environmental temperature data of a location within a datacenter provided by at least one thermal sensor;

access electrical power consumption data of servers operating in the datacenter provided by a plurality of power distribution units (PDUs);

access a plurality of surface temperature images, of a point-of-interest (POI) within the datacenter, captured by one or more thermal cameras of a mobile robot navigating throughout the datacenter via a transit route directed to the POI, a capture of the plurality of surface temperature images comprising:

capturing a first surface temperature image of the POI at a first time instance; and capturing a second surface temperature image of the POI at a second time instance that is later than the first time instance; and determine, by a datacenter operations controller, a potential anomalous thermal condition of the POI based on a correlation between at least one of the plurality of surface temperature images of the POI and at least one of: (i) the environmental temperature data, and (ii) the electrical power consumption data, wherein determining the potential anomalous thermal condition comprises:

generating a temperature gradient profile associated with the POI based on the first surface temperature image and the second surface temperature image, in which the temperature gradient profile determines a rate of temperature change between the first time instance and the second time instance, comparing the temperature gradient profile of the POI with a correlation look-up table comprising a set of correlations between the environmental temperature data, the electrical power consumption data, and expected temperatures of POIs, a potential anomalous thermal condition being identified based on a change in the environmental temperature data from past temperature data based on the temperature gradient profile and/or an inconsistency between the environmental temperature data and the electrical power consumption data based on the temperature gradient profile; and causing at least one server corresponding to the POI to power down based on the temperature gradient profile.

15. The non-transitory computer-readable medium of claim 14, wherein the electrical power consumption data comprises electrical power consumption data of servers associated with the POI.

16. The non-transitory computer-readable medium of claim 14, wherein the transit route is generated based on the environmental temperature data or the electrical power consumption data.

* * * * *